(12) United States Patent
Shiraishi

(10) Patent No.: US 7,728,426 B2
(45) Date of Patent: Jun. 1, 2010

(54) SEMICONDUCTOR DEVICE

(75) Inventor: Yasushi Shiraishi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 245 days.

(21) Appl. No.: 11/702,151

(22) Filed: Feb. 5, 2007

(65) Prior Publication Data
US 2007/0210378 A1    Sep. 13, 2007

(30) Foreign Application Priority Data
Mar. 8, 2006   (JP) .............................. 2006-062839

(51) Int. Cl.
*H01L 23/36* (2006.01)
(52) U.S. Cl. ................ 257/712; 257/713; 257/720; 257/E23.102; 257/E23.104
(58) Field of Classification Search ................ 257/669, 257/675, 706, 707, 712, 713, 717–720, 730, 257/796, E23.102, E23.104, E23.113
See application file for complete search history.

(56) References Cited

U.S. PATENT DOCUMENTS 6,768,205 B2 * 7/2004 Taniguchi et al. ........... 257/774

2002/0075106 A1 * 6/2002 Okubora et al. ............. 333/247
2004/0159954 A1 * 8/2004 Hetzel et al. ................ 257/777
2004/0183205 A1 * 9/2004 Yamaguchi ................. 257/774
2004/0207075 A1 * 10/2004 Noguchi ..................... 257/712
2005/0199995 A1 * 9/2005 Nomoto et al. ............. 257/692

FOREIGN PATENT DOCUMENTS

| JP | 11-186430 | | 7/1999 |
| JP | 2001-094000 A | * | 6/2001 |
| JP | 2001-168139 | | 6/2001 |

* cited by examiner

*Primary Examiner*—Jerome Jackson, Jr.
*Assistant Examiner*—Yu Chen
(74) *Attorney, Agent, or Firm*—Rabin & Berdo, PC

(57) ABSTRACT

A semiconductor device 10 includes a silicon substrate 20 having a first interconnection layer 24, a second interconnection layer 26, and grooves 22 provided at the second main surface 20b. Mounted on the substrate 20 are one or more semiconductor chips 30 having chip external terminals 32 electrically connected to the first interconnection layer; and one or more peripheral chips 40 electrically connected to the first interconnection layer on the silicon substrate. By the provision of the grooves 22, the heat radiating property is improved.

11 Claims, 5 Drawing Sheets

SEMICONDUCTOR DEVICE

BACKGROUND OF THE INVENTION

The present invention relates a semiconductor device, in particular to a semiconductor device with improved heat radiating property.

Due to the development of the process technology of semiconductor devices in recent years, the process rule and the size of the semiconductor device are becoming smaller and smaller. Moreover, the demands on the semiconductor device for more increased integration and more increased output power are becoming more and more stronger.

It is thus increasing more desired to improve the radiation of heat from semiconductor chips contained in the semiconductor device, in order to prevent failure in operation, and damages to the semiconductor device due to the heat generated by the semiconductor chip, and the poor heat radiation of the semiconductor device packages.

To meet with the demands, and to prevent the bending of a substrate due to the heat generated by the semiconductor chips, Japanese Patent Kokai Publication No. H11-186430 discloses a semiconductor device comprising a semiconductor chip having a plurality of electrodes, a glass epoxy resin substrate on which the semiconductor chip is mounted, and which has leads connected to the respective electrodes, external electrodes provided on the conductor patterns electrically connected to the leads, wherein slits are provided in the glass epoxy resin substrate.

Japanese Patent Kokai Publication No. 2001-168139 discloses a structure in which a plurality of columnar protrusion electrodes are provided on the peripheral parts of the lower surface of the silicon substrate, grooves are provided to extend along each side of the silicon substrate, at portions corresponding to the protrusion electrodes on each side, and inside of the protrusion electrodes, on the upper surface of the silicon substrate, in order to relax stress due to thermal expansion, and to prevent cracks in the protruding electrodes and connecting terminals.

In the conventional semiconductor devices of such structures, it is becoming more difficult to ensure radiation of heat from the lower surface of the substrate on which a semiconductor chip is mounted, and in which a particularly greater amount of heat is generated.

Because the heat radiation property is not sufficient, the electrical property may be degraded, and malfunction may be caused.

SUMMARY OF THE INVENTION

The present invention has been achieved to solve the problem discussed above, and provides a semiconductor device which comprises:

a substrate having
  a first main surface,
  a second main surface opposite to the first main surface,
  a first insulating film provided on the first main surface,
  a first interconnection layer including a plurality of interconnection conductors extending over the first insulating film,
  a second insulating film provided on the second main surface,
  a second interconnection layer including a plurality of interconnection conductors extending over the second insulating film,
  through holes extending from the first main surface to the second main surface, and open at the first insulating film and the second insulating film,
  contacts filling the through holes and being electrically connected to the first interconnection layer and the second interconnection layer,
  a plurality of substrate external terminals electrically connected to the second interconnection layer, and
  at least one groove provided at the second main surface;
one or more semiconductor chips each having a front surface, a rear surface opposite to the front surface, and chip external terminals provided on the rear surface and electrically connected to the first interconnection layer on the substrate; and
one or more peripheral chips electrically connected to the first interconnection layer on the substrate.

According to the invention, the surface area of the lower surface of the substrate on which the semiconductor chip from which a substantial amount of heat is generated, is increased. As a result, the radiation of heat from the lower surface can be improved, and failure or troubles in operation caused by the heat generated during operation of the semiconductor chip can be prevented.

BRIEF DESCRIPTION OF THE DRAWINGS

The invention will be more apparent from the following description in connection with the drawings, in which.

DETAILED DESCRIPTION OF THE PREFERRED EMBODIMENTS

Figure 1A:
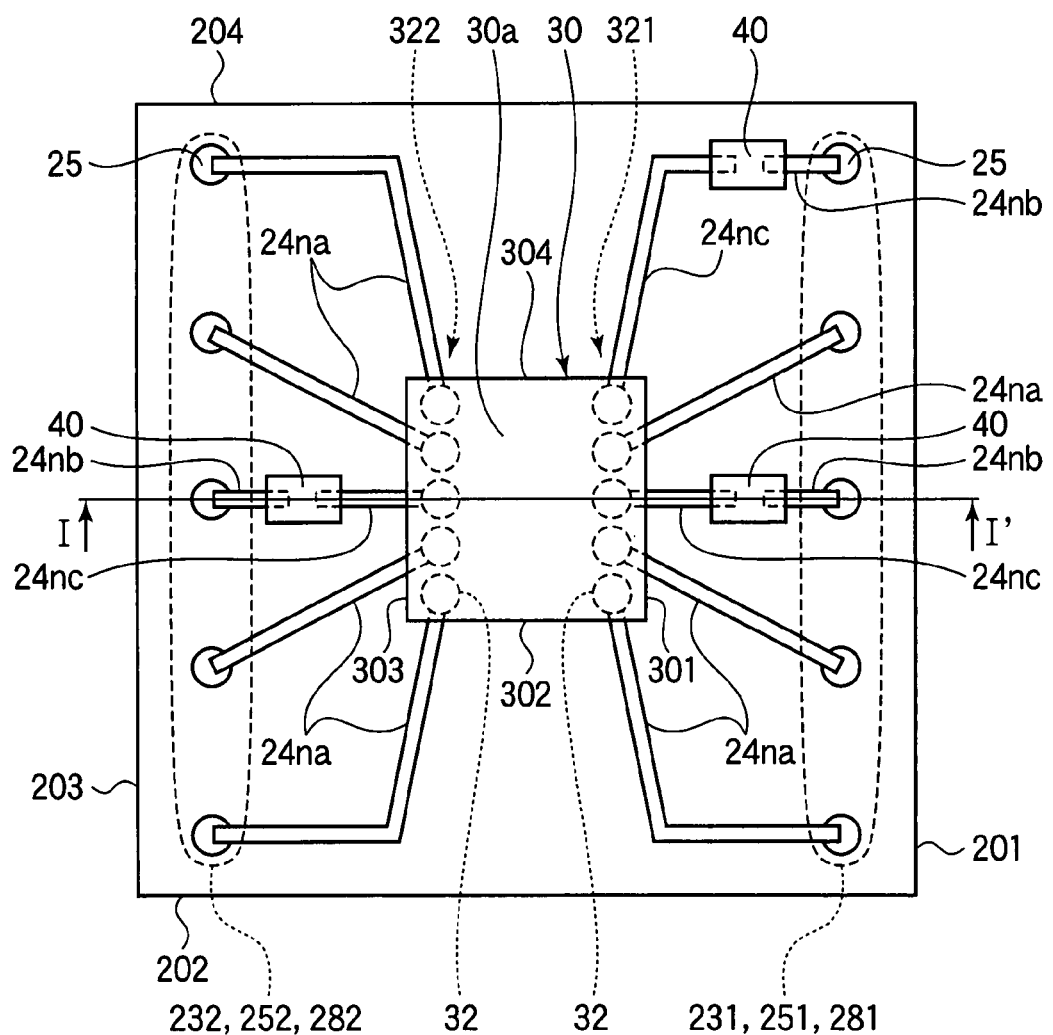
FIG. 1A is a plan view of the semiconductor device of Embodiment 1 of the present invention.

Embodiments of the invention will now be described in detail with reference to the drawings. The drawing schematically illustrate the shape, size and arrangement of the respective parts and elements, and the exemplary illustration of the shape, size and arrangement should not be construed as limiting the invention. Moreover, in the following description, the specific material, condition, numeral conditions may be given, but they should construed as preferred examples, and should not be taken as limiting the invention. In addition, terms "upper" and "lower" will be used for the sake of convenience of description, they should not be taken as limiting the direction in the semiconductor device in actual use.

Embodiment 1

A semiconductor device of Embodiment 1 of the present invention will now be described referring to FIG. 1A, FIG. 1B and FIG. 2.

Figure 1B:
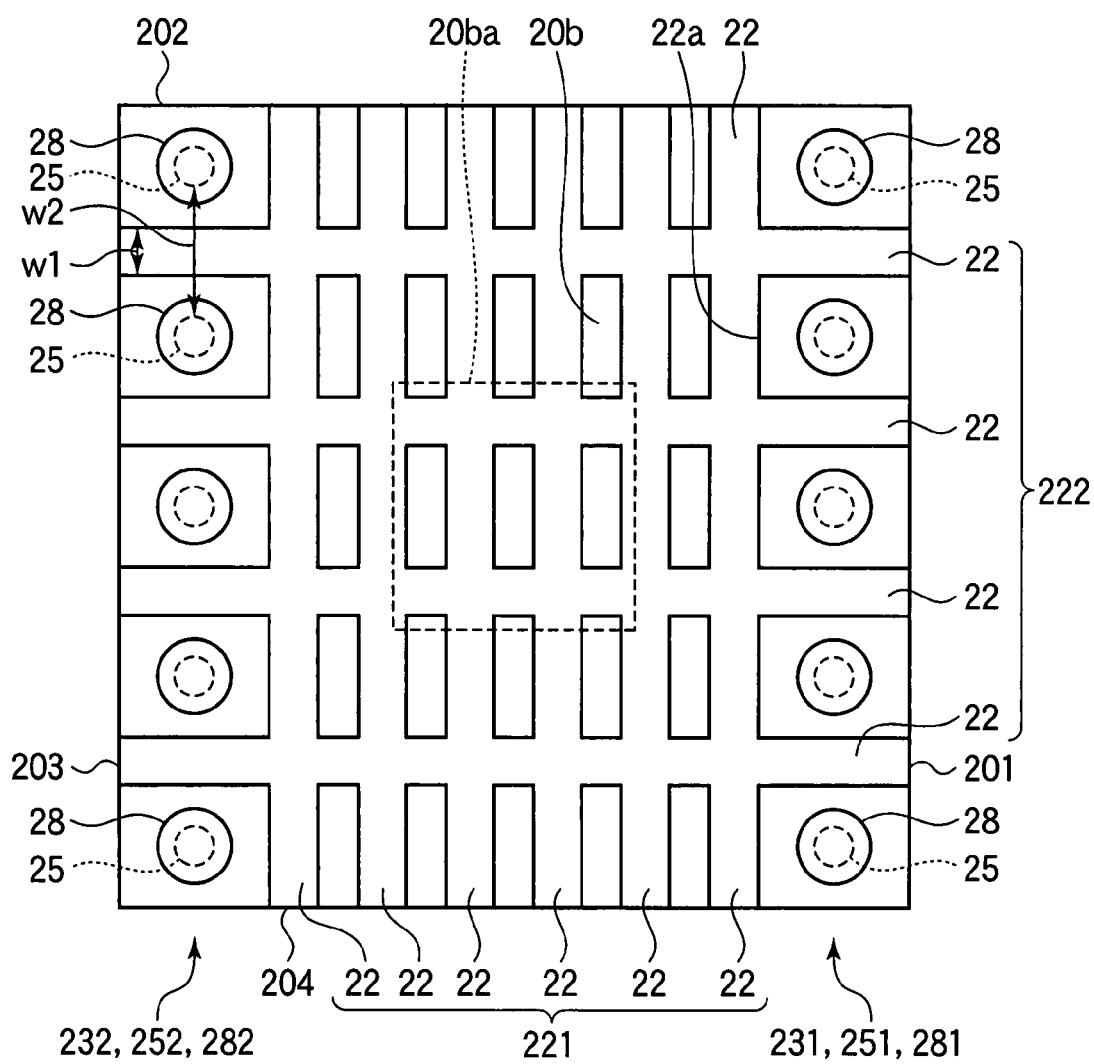
FIG. 1B is a bottom view of the semiconductor device of Embodiment 1.

FIG. 1A is a plan view of a semiconductor device of Embodiment 1, and FIG. 1B is a bottom view of the semiconductor device of Embodiment 1. FIG. 2 is a schematic sectional view along line I-I' in FIG. 1A.

Figure 2:
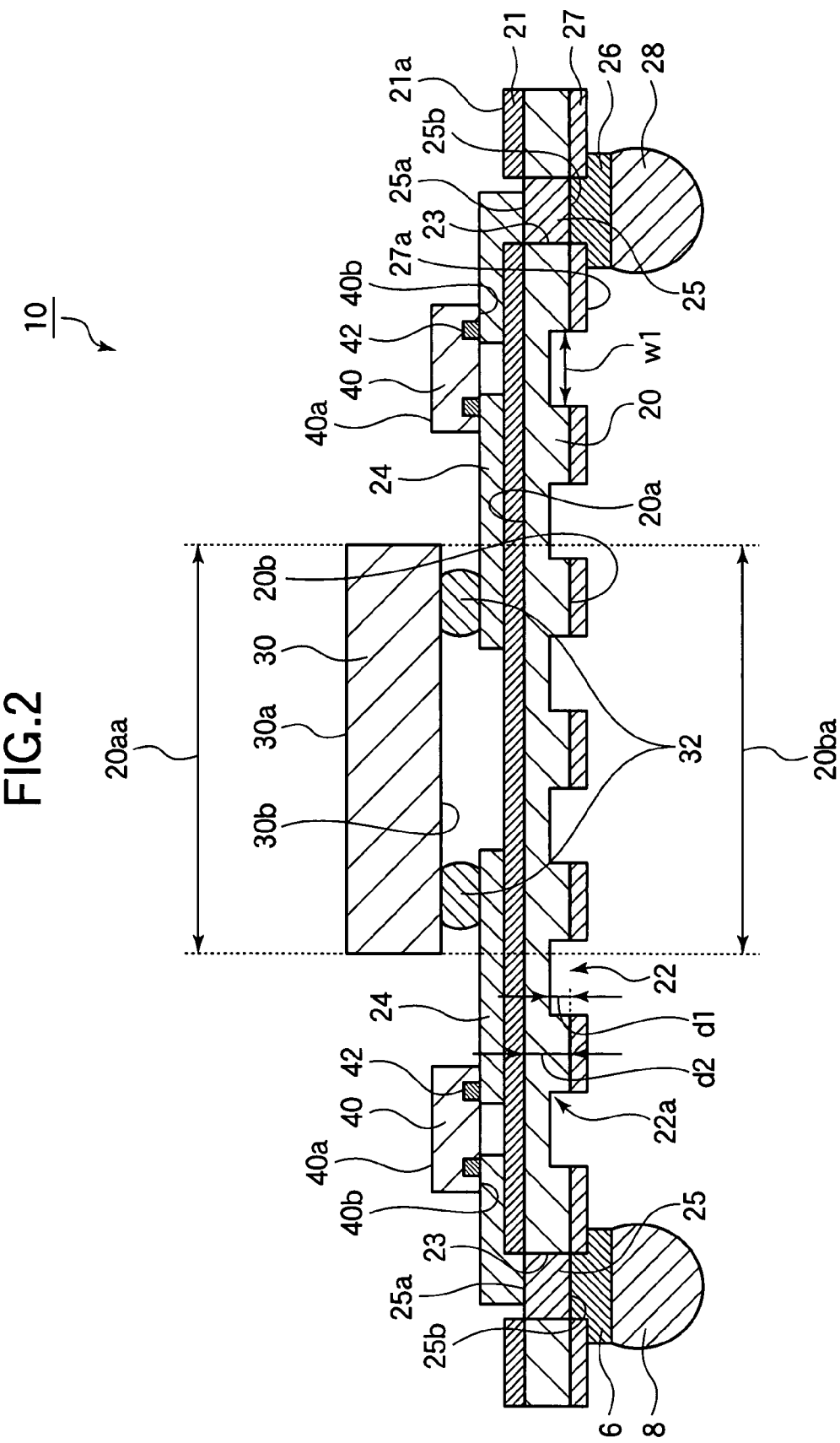
FIG. 2 is a schematic cross sectional view along line I-I' in FIG. 1A.

As shown in FIG. 2, the semiconductor device (module) 10 includes a substrate 20. The substrate 20 is preferably a silicon substrate, for example. However, the substrate 20 may be a substrate of metal such as aluminum, a glass substrate, an organic resin substrate such as a glass epoxy substrate, a flexible print substrate, or the like.

The substrate 20 has a first main surface (upper surface) 20a, and a second main surface (lower surface) 20b opposite to the first main surface 20a. In the illustrated example, the first main surface 20a and the second main surface 20b are both rectangular, and more specifically square, in shape. The substrate 20 therefore has first, second, third and fourth sides 201, 202, 203 and 204. The first and third sides 201 and 203 are parallel with and opposite to each other. The second and fourth sides 202 and 204 are parallel with and opposite to each other.

The first main surface 20a of the substrate 20 has a chip mounting area 20aa in which a semiconductor chip 30 (to be described later) is mounted. In the illustrated example, the chip mounting area 20aa is positioned at the center of the first main surface 20a.

Provided on the first main surface 20a is a first insulating film 21. Provided on the second main surface 20b is a second insulating film 27.

Provided around the chip mounting area 20aa are a plurality of through holes 23. The through holes 23 extend from the first main surface 20a to the second main surface 20b, and are open at the surface 21a of the first insulating film 21 and at the surface 27a of the second insulating film 27.

The through holes 23 are arranged in two rows. A first row 231 of the through holes 23 extend along the first side 201 of the substrate 20. A second row 232 of the through holes 23 extend along the third side 203 of the substrate 20. The through holes 23 in each row are provided at an equal interval, i.e., equally spaced.

The through holes 23 are filled with a conductive material, to form contacts 25. Because the through holes 23 are arranged in the two rows 231 and 232, the contacts 25 are also arranged in two corresponding rows 251 and 252. First top surfaces 25a of the contacts 25 are substantially level with the first main surface 20a of the substrate 20, and exposed from the surface 20a. Similarly, second top surfaces 25b of the contacts 25 are substantially level with the second main surface 20b of the substrate 20, and exposed from the surface 27a.

Provided on the surface 21a of the first insulating film is a first interconnection layer 24, which includes a plurality of interconnection conductors 24na, 24nb, and 24nc, at least some of which extend through the chip mounting area 20aa. At least some of the interconnection conductors 24na, 24nb, and 24nc extend through the areas surrounding the chip mounting area 20aa.

The first interconnection layer 24 includes, for example, a first group of interconnection conductors 24na having one ends electrically connected to the first top surfaces 25a of some of the contacts 25, and the other ends connected to terminals of the mounted semiconductor chip 30, a second group of interconnection conductors 24nb having one ends electrically connected to the first top surfaces 25a of some of the contacts 25, and the other ends connected to terminals of mounted parts such as peripheral chips 40, to be described later, and a third group of interconnection conductors 24nc having one ends connected to the peripheral chips 40, and the other ends electrically connected to terminals of the semiconductor chip 30.

The interconnection layer 24 may additionally includes interconnection conductors (not shown) having both ends electrically connected to terminals of peripheral chips (not shown) similar to the illustrated peripheral chips 40.

The ends of the interconnection conductors (24na, 24nb, 24nc) are in the form of electrode pads (first electrode pads).

Actually, a surface-insulating film covering the surface of the interconnection layer 24 except at the electrode pads are provided, but is omitted in the drawing, in order to simplify the illustration.

Provided on the surface 27a is a second interconnection layer 26, which includes a plurality of interconnection conductors, which have for example one ends electrically connected to the second-top surfaces 25b of the contacts 25, and extend over the second main surface 20b. The other ends of these interconnection conductors are in the form of electrode pads (second electrode pads). In the example, the second interconnection layer 26 are formed as electrode pads provided on the second top surfaces 25b of the contacts 25.

Provided on the second interconnection layer 26 are a plurality of substrate external terminals 28. In the illustrated example, the substrate external terminals 28 are formed of soldering balls. The substrate external terminals 28 are provided for example in alignment with the contacts 25, and as the contacts 25 are provided in two rows 251 and 252, the substrate external terminals 28 are also provided in two corresponding rows 281 and 282.

The substrate external terminals 28 may not be in alignment with the contacts 25, and the substrate external terminals 28 may assume any arrangement as long as they are connected to the second interconnection layer 26 extending over the second main surface 20b. The substrate external terminals 28 may also be in a grid arrangement, to form a so-called BGA (ball-grid array).

Provided at the second main surface 20b of the substrate 20 are a plurality of grooves (slits) 22. The grooves 22 are concaves or indents formed by engraving from the second main surface 20b into the thickness of the substrate 20.

As illustrated in FIG. 2, the cross section of each groove 22 is substantially rectangular in shape defined by an internal side surface and the internal bottom surface. The internal surface 22 may assume any other form, and may for example semicircular.

As seen in the bottom view, at least one groove extends linearly, at least at a part thereof. In the illustrated example, all the grooves extend linearly. The grooves 22 are in two groups 221 and 222. A first group 221 consists of the grooves extending in parallel with the first and third sides 201 and 203, and hence in parallel with the rows 231 and 232 of the through holes 23, and in parallel with the rows 281 and 282 of the chip external terminals 28. A second group 222 consists of the grooves extending parallel with the second and fourth sides 202 and 204, and hence perpendicular to the first and third sides 201 and 203, perpendicular to the rows 231 and 232 of the through holes 23, and perpendicular to the rows 281 and 282 of the chip external terminals 28. The first group 221 of the grooves 22 and the second group 222 of the grooves 22 thus intersect with each other, forming a grid.

The grooves 22 are provided to extend through an area 20ba at the second main surface 20b directly opposite to (in other words, "directly under" or "in alignment with") the chip mounting area 20aa on the first main surface 20a, as well as areas surrounding the area 20ba. Thus, the grooves 22 are provided in an area directly opposite ("directly under" or "in alignment with") the semiconductor chip 30 to be mounted, as will be later described in detail.

The grooves 22 of the first group 221 extending in the direction of arrangement (direction of the rows 281 and 282) of the substrate external terminals 28 are provided to extend through the area between the two rows 281 and 282 of the substrate external terminals 28 opposite to each other, i.e., the area including the area 20ba directly opposite to the chip mounting area 20aa, and are equally spaced from each other. In the illustrated example, six such grooves 22 are provided and equally spaced from each other. The number of the grooves 22 may be different from that of the illustrated example, and may be decided to be appropriate. For example, a single wider groove 22 may be provided between the two rows 281 and 282 of the substrate external terminals 28.

The grooves 22 extending in the direction perpendicular to the direction of arrangement (direction of the rows 281 and 282) of the substrate external terminals 28 are provided to extend through the spaces between adjacent ones of the substrate external terminals 28 of each of the rows 281 and 282, and in the area between the two rows 281 and 282 of the substrate external terminals 28 opposite to each other, i.e., the area including the area 20ba directly opposite to the chip mounting area 20aa, and are equally spaced from each other. In the illustrated example, four such grooves 22 are provided and are equally spaced from each other. The four grooves 22 are equally spaced from the substrate externals terminals 28 on each side of each groove 22.

The width w1 of the open end of each groove 22 at the second main surface 20b may be of any appropriate value as long as it is within the range smaller than the distance w2 between the closer edges of the adjacent through holes 25.

The width w1 is preferably not more than 100 μm, if the pitch of the substrate external terminals 28 (distance between the centers of adjacent substrate external terminals 28) is 0.5 mm.

The depth d1 of the groove 22 should be determined taking into consideration of the rigidity of the resultant semiconductor device (the manufactured semiconductor device) as a whole, and is preferably of about one-third (1/3) of the thickness d2 of the substrate 20. For instance, if the thickness d2 is 400 to 450 μm, the depth d1 is preferably within the range of 100 to 150 μm.

The manner of forming the grooves 22 is next described.

The grooves 22 are preferably formed by cutting, by a so-called dicing process. This process can be implemented by using a conventional dicing machine.

The width w1 of the groove 22 will then be determined by the width of the blade of the dicing machine. When the blade used in the conventional dicing process is used, grooves 22 with the width d1 of 50 to 60 μm are formed. If the width of the blade of the dicing machine is increased, the width w1 will also be increased.

With regard to the cutting conditions, the rotating speed of the blade is set to be 30,000 rpm to 40,000 rpm, for example, and the feeding speed of the dicing stage (on which the substrate is mounted during the cutting) is set to be 30 mm/sec. to 50 mm/sec., and the substrate 20 is cut ("half-cut") to the depth d1 which is one-third of the thickness d2 of the substrate 20.

The manner of forming the grooves 22 is not limited to that described above, and the grooves may be formed in any other manner, e.g., by cutting or etching. When for instance an etching process is adopted, the grooves may be formed to extend in any manner, e.g., to extend along a curve, at least at a part of the length of the groove 22.

The grooves 22 are shown to be of the same shape (shape in the direction of the extension, and the shape of the cross section), and have the same width, and have the same depth. The depth, the length along the extension, and the shape of the cross section of each groove may be determined independently. The depth, the length along the extension, and the shape of the cross section may differ from one groove to another.

The semiconductor device 10 is provided with one or more semiconductor chips. In the illustrated example, the semiconductor device is provided with just one semiconductor chip 30. The semiconductor chip 30 has a front surface (upper surface) 30a, and a rear surface (lower surface) 30b opposite to the front surface 30a. Both of the front surface 30a and the rear surface 30b of the illustrated semiconductor chip 30 are square, and the semiconductor chip 30 has first, second, third and fourth sides 301, 302, 303 and 304. The first and the third sides 301 and 303 are parallel with, and opposite to each other and the second and fourth sides 302 and 304 are parallel with, and opposite to each other. Provided on the rear surface 30b are a plurality of chip external terminals 32. The chip external terminals 32 are arranged in two rows 321 and 322 extending along the first and third sides 301 and 303, and the chip external terminals 32 of each row are equally spaced from each other.

The semiconductor chip 30 is mounted on the first main surface 20a of the substrate 20, in such a manner that the rows 321 and 322 of the chip external terminals 32 are parallel with the rows 251 and 252 of the through holes 25.

The chip external terminals 32 of the semiconductor chip 30 are electrically connected to the first interconnection layer 24 of the substrate 20.

The semiconductor chip 30 may be a so-called bare chip, or may be a semiconductor chip encapsulated by resin, such as the one called a chip-size package.

The semiconductor device 10 may be provided with one or more peripheral chips. In the illustrate example, three peripheral chips 40 are provided. Each of the peripheral chips 40 has a front surface (upper surface) 40a and a rear surface (lower surface) 40b opposite to the front surface 40a. Provided on the rear surface 40b are a plurality of terminals 42 for external connection. In the illustrated example, each peripheral chip 40 has two terminals 42.

The terminals 42 are electrically connected, independently from each other, to the first interconnection layer 24 on the substrate 20. In the illustrated example, one terminal of the peripheral chip 40 is connected to one end of the interconnection conductor 24nc having the other end connected to the chip external terminal 32 of the semiconductor chip 30, while the other terminal of the peripheral chip 40 is connected to one end of the interconnection conductor 24nb having the other end connected to the contact 25.

The peripheral chips 40 may be passive elements, such as a capacitor element, a resistor element, or an inductor element. However, the peripheral chips 40 may be other than passive elements.

According to the semiconductor device is configured as described above, the surface area of the lower surface of the substrate forming the module can be increased, so that the heat radiation from the lower surface can be improved. As a result, malfunction due to the heat generation during the operation of the semiconductor chip can be effectively prevented.

Embodiment 2

A semiconductor device of Embodiment 2 of the invention will next be described with reference to FIG. 3.

Figure 3A:
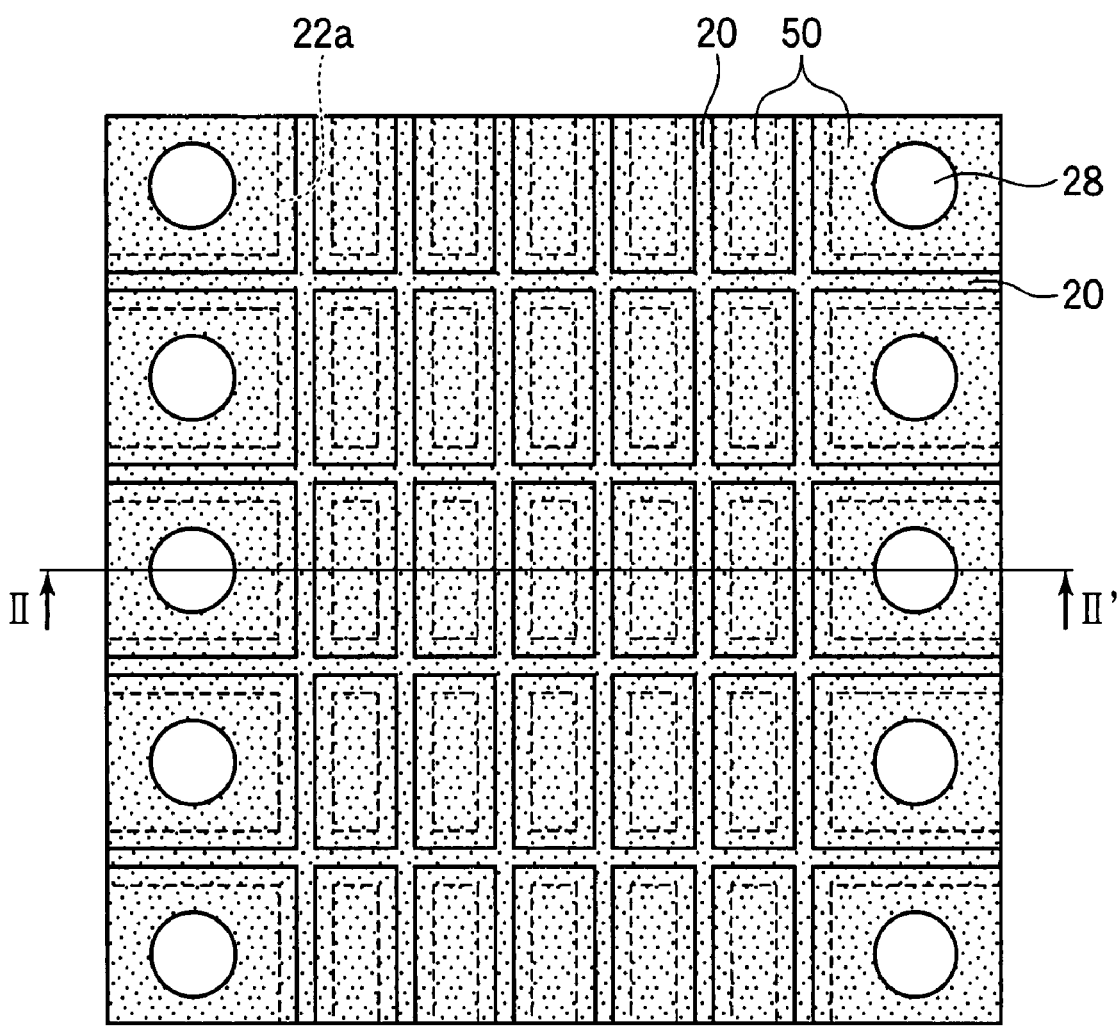
FIG. 3A is a bottom view of the semiconductor device of Embodiment 2 of the present invention.
Figure 3B:
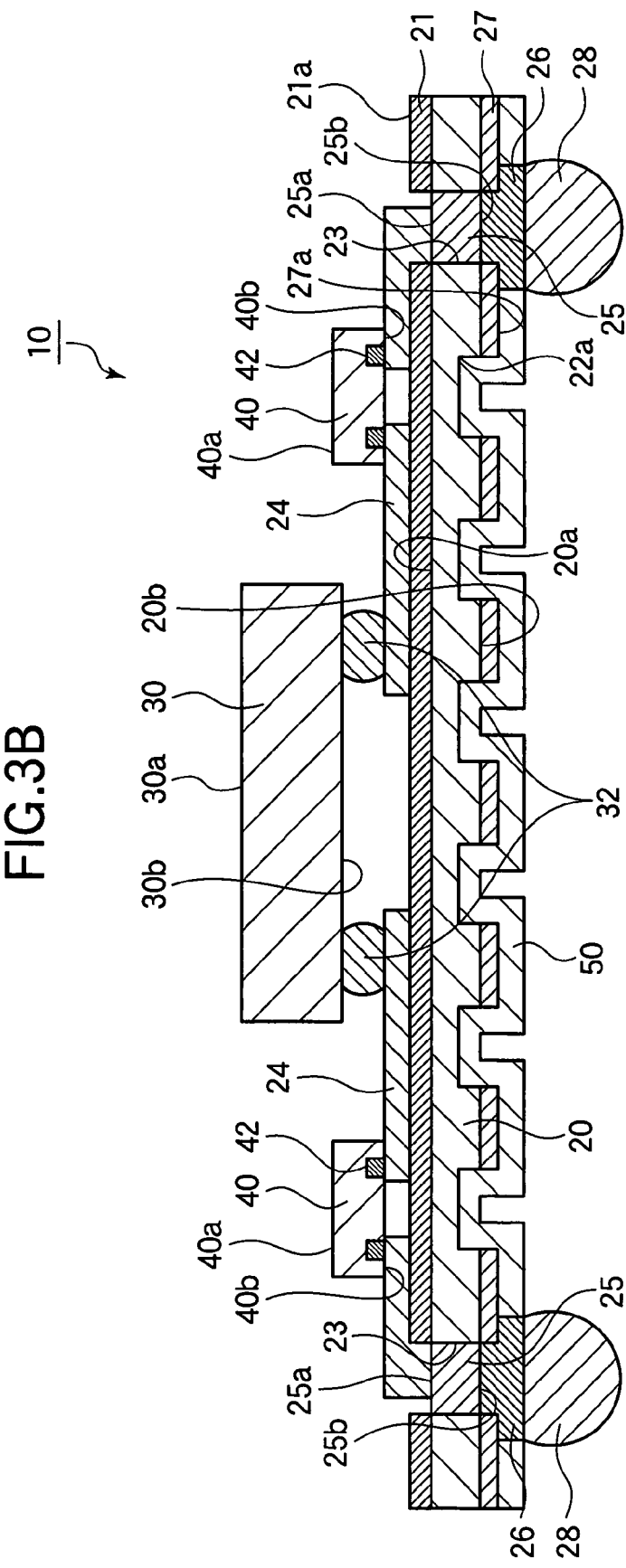
FIG. 3B is a schematic cross sectional view along line II-II' in FIG. 1A.

FIG. 3A is a bottom view of the semiconductor device of Embodiment 2. FIG. 3B is a schematic cross sectional view along the line II-II' in FIG. 3A. The plan view of the semiconductor device of Embodiment 2 will be the same as FIG. 1A.

The semiconductor device of Embodiment 2 is similar to the semiconductor device of Embodiment 1, but is additionally provided with a heat radiating member 50 provided on the second main surface 20b of the substrate 20. That is, the semiconductor device 10 of Embodiment 2 is identical to the semiconductor device 10 of Embodiment 1, except for the addition of the heat radiating member 50. Accordingly, parts or members identical to those in Embodiment 1 are identified by the same reference numerals, and their description is omitted.

The substrate 20 has a first main surface 20a, and a second main surface 20b opposite to the first main surface 20a.

The heat radiating member 50 in the illustrated example is provided on the surface 27a of the second insulating film 27, and also on the inner surfaces 22a of the grooves 22, including the inner side surfaces and the inner bottom surfaces of the grooves 22. The concaves or indents formed by the surface of the heat radiating member 50 covering the inner surfaces 22a may also be referred to as "grooves" 22.

The heat radiating member 50 is preferably a sheet-shaped material, covering, and being attached intimately (without leaving any gap) to the surface 27a and the inner surfaces 22a. Specifically, a heat radiating sheet, which is commercially available, may be used.

The sheet may be attached so that parts of the second interconnection layer 26 are exposed so that they serve as electrode pads (second electrode pads).

The heat generating member 50 may be formed by applying a liquid containing a heat radiating material, and drying the coated liquid to form a coated film. An example of such a liquid is a liquid ceramics, which is commercially available under the trademark "Cerac α" and is produced by Oki Electric Industry Co., Ltd.

In this case too, parts of the second interconnection layer 26 at which the substrate external terminals are to be provided are exposed to form electrode pads (second electrode pads).

The substrate external terminals 28 are electrically connected to the electrode pads exposed by the heat radiating member 50 formed of the sheet material, or formed of a coated film, and mounted.

The semiconductor device of Embodiment 2 has an improved heat radiating property over the semiconductor device of Embodiment 1. The resistance to heat of the semiconductor device can be further improved.

The invention has been described in connection with specific embodiments. However, it should be noted that various modifications and variations are possible without departing from the scope of the invention.

What is claimed is:

1. A semiconductor device comprising:
   a substrate having
      a first main surface having a chip mounting portion,
      a second main surface opposite to the first main surface,
      a first insulating film provided on the first main surface,
      a first interconnection layer including a plurality of interconnection conductors extending over the first insulating film,
      a second insulating film provided on the second main surface,
      a second interconnection layer including a plurality of interconnection conductors extending over the second insulating film,
      through holes extending from the first main surface to the second main surface, and open at the first insulating film and the second insulating film,
      contacts filling the through holes and being electrically connected to the first interconnection layer and the second interconnection layer,
      a plurality of substrate external terminals electrically connected to the second interconnection layer, and
      at least one groove provided at the second main surface, said groove being provided in at least a portion of said second main surface opposite to said chip mounting portion of said first main surface;
   one or more semiconductor chips mounted in said chip mounting portion of said first main surface, each of said semiconductor chips having a front surface, a rear surface opposite to the front surface, and chip external terminals provided on the rear surface and electrically connected to the first interconnection layer on the substrate;
   one or more peripheral chips electrically connected to the first interconnection layer on the substrate; and
   a heat radiating member covering the second main surface and the inner surface of the groove.

2. The semiconductor device as set forth in claim 1, wherein the substrate is a silicon substrate.

3. The semiconductor device as set forth in claim 1, wherein
   two or more grooves are provided,
   the two or more grooves extend linearly, and
   one of the grooves extends in a first direction and the other of the grooves extends in a second direction perpendicular to the first direction.

4. The semiconductor device as set forth in claim 1, wherein a plurality of the grooves are provided, and the grooves have the same width and the same depth.

5. The semiconductor device as set forth in claim 1, wherein said at least one groove is provided in an area including an area directly under the area where the semiconductor chip is mounted.

6. The semiconductor device as set forth in claim 1, wherein said at least one groove extends perpendicular to a linearly arranged row of the substrate external terminals, and the width of said groove is narrower than the distance between the substrate external terminals in each of the rows of the substrate external terminals.

7. The semiconductor device as set forth in claim 1, wherein
   a plurality of the grooves are provided, and extend perpendicular to a linearly arranged row of the substrate external terminals, and extend through the respective spaces between adjacent ones of the substrate external terminals in each of the rows of the substrate external terminals, and
   the width of each groove is narrower than the distance between the substrate external terminals in each of the rows of the substrate external terminals.

8. The semiconductor device as set forth in claim 1, wherein the depth of the groove is not more than one third of the thickness of the substrate.

9. The semiconductor device as set forth in claim 1, wherein the peripheral chips include an element selected from a group of elements consisting of a capacitor element, a resistive element, and an inductor element.

10. The semiconductor device as set forth in claim 1, wherein said heat radiating member is a sheet member.

11. The semiconductor device as set forth in claim 1, wherein the heat radiating member is a heat radiating layer formed by applying a liquid material, and drying to form a coated film.

* * * * *